(12) United States Patent
Zhu et al.

(10) Patent No.: US 12,457,799 B2
(45) Date of Patent: Oct. 28, 2025

(54) ANTENNA STRUCTURE

(71) Applicant: GlobalFoundries U.S. Inc., Malta, NY (US)

(72) Inventors: Xuelian Zhu, San Jose, CA (US); Navneet K. Jain, Milpitas, CA (US); Juhan Kim, Santa Clara, CA (US); James P. Mazza, Saratoga Springs, NY (US); Jia Zeng, Sunnyvale, CA (US); David C. Pritchard, Glenville, NY (US); Mahbub Rashed, Cupertino, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 281 days.

(21) Appl. No.: 18/118,317

(22) Filed: Mar. 7, 2023

(65) Prior Publication Data

US 2024/0304616 A1    Sep. 12, 2024

(51) Int. Cl.
| | | |
|---|---|---|
| *H01Q 1/38* | (2006.01) |
| *H01L 27/06* | (2006.01) |
| *H01Q 1/22* | (2006.01) |
| *H01Q 1/48* | (2006.01) |
| *H10D 84/40* | (2025.01) |
| *H10D 84/80* | (2025.01) |
| *H10D 89/60* | (2025.01) |

(52) U.S. Cl.
CPC .......... *H10D 84/40* (2025.01); *H01Q 1/2283* (2013.01); *H01Q 1/38* (2013.01); *H01Q 1/48* (2013.01); *H10D 84/811* (2025.01); *H10D 89/611* (2025.01)

(58) Field of Classification Search
CPC .... H10D 84/40; H10D 84/811; H10D 89/611; H01L 27/0617; H01Q 1/38; H01Q 1/48; H01Q 1/2283
See application file for complete search history.

(56) References Cited

U.S. PATENT DOCUMENTS

| | | | |
|---|---|---|---|
| 8,264,065 B2 * | 9/2012 | Su | H01L 23/62 257/E21.597 |
| 9,773,811 B2 * | 9/2017 | Lorenz | H10D 86/201 |
| 10,096,595 B2 | 10/2018 | Kim et al. | |
| 2014/0159157 A1 * | 6/2014 | Jensen | H10D 30/60 438/294 |
| 2017/0125403 A1 * | 5/2017 | Kim | H10D 1/00 |

\* cited by examiner

*Primary Examiner* — Hai V Tran
(74) *Attorney, Agent, or Firm* — David Cain; Andrew M. Calderon; Calderon Safran & Wright P.C.

(57) ABSTRACT

The present disclosure relates to semiconductor structures and, more particularly, to antenna structures and methods of manufacture. The structure includes an antenna cell comprising a single P-well isolated by a deep trench isolation structure and including at least one diffusion region.

17 Claims, 4 Drawing Sheets

ANTENNA STRUCTURE

BACKGROUND

The present disclosure relates to semiconductor structures and, more particularly, to antenna structures and methods of manufacture.

In radio communication devices, an antenna is used to transmit and receive signals. Radio communication devices can also comprise various logic that is used to carry out the desired operations of the radio communication. In some examples, the antenna is manufactured on the semiconductor chip. In these implementations, though, the antenna is a large metal structure which consumes an undesirable amount of space on the chip.

The antenna rules may give an allowable ratio of metal area to gate area for each interconnect layer. In practical applications, violations of the rules cannot be avoided and, thus, different schemes need to be provided for fixing or accounting for such violations on the actual design. These mechanisms may include the use of protection diodes. For example, the protection diodes may be formed with an $n^+$ implant in a p-substrate or a $p^+$ implant in an n-well. By connecting the diodes to a metal element near the gate the diode can protect the gate dielectric against charging damages. However, in fully depleted SOI (FDSOI) cell designs with wells formed below p-channel FETs and n-channel FETs, there are no provisions for fixing antenna effects. For example, in a standard antenna cell the antenna cell is connected to either a P-well bias voltage for an NFET (VPW_N) or P-well bias voltage for a PFET (VPW_P) at block level, which runs the risk of becoming forward bias.

SUMMARY

In an aspect of the disclosure, a structure comprises an antenna cell comprising a single P-well isolated by a deep trench isolation structure and comprising at least one diffusion region.

In an aspect of the disclosure, a structure comprises: an antenna cell comprising a first diffusion region of a first dopant type isolated from a second diffusion region of a second dopant type, both of the first diffusion region and the second diffusion region being in a well of the first dopant type; a contact to ground and the antenna cell; and an isolation structure isolating the antenna cell from other structures on a chip.

In an aspect of the disclosure, a method comprises forming an antenna cell comprising a single P-well isolated by a deep trench isolation structure and comprising at least one diffusion region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to antenna structures and methods of manufacture. More specifically, the present disclosure relates to antenna structures comprising an isolated P-well that is used to form a reverse bias diode. The isolated P-well can be isolated using a deep trench ring to form a separate node from a P-well bias voltage for an NFET (VPW_N) or P-well bias voltage for a PFET (VPW_P) Advantageously, the antenna structures are a compact design and can be directly connect to ground instead of a P-well bias voltage for an NFET or P-well bias voltage for a PFET to reduce the risk of a P/N diode becoming forward bias.

The antenna structures of the present disclosure can be manufactured in a number of ways using a number of different tools. In general, though, the methodologies and tools are used to form structures with dimensions in the micrometer and nanometer scale. The methodologies, i.e., technologies, employed to manufacture the antenna structures of the present disclosure have been adopted from integrated circuit (IC) technology. For example, the structures are built on wafers and are realized in films of material patterned by photolithographic processes on the top of a wafer. In particular, the fabrication of the antenna structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
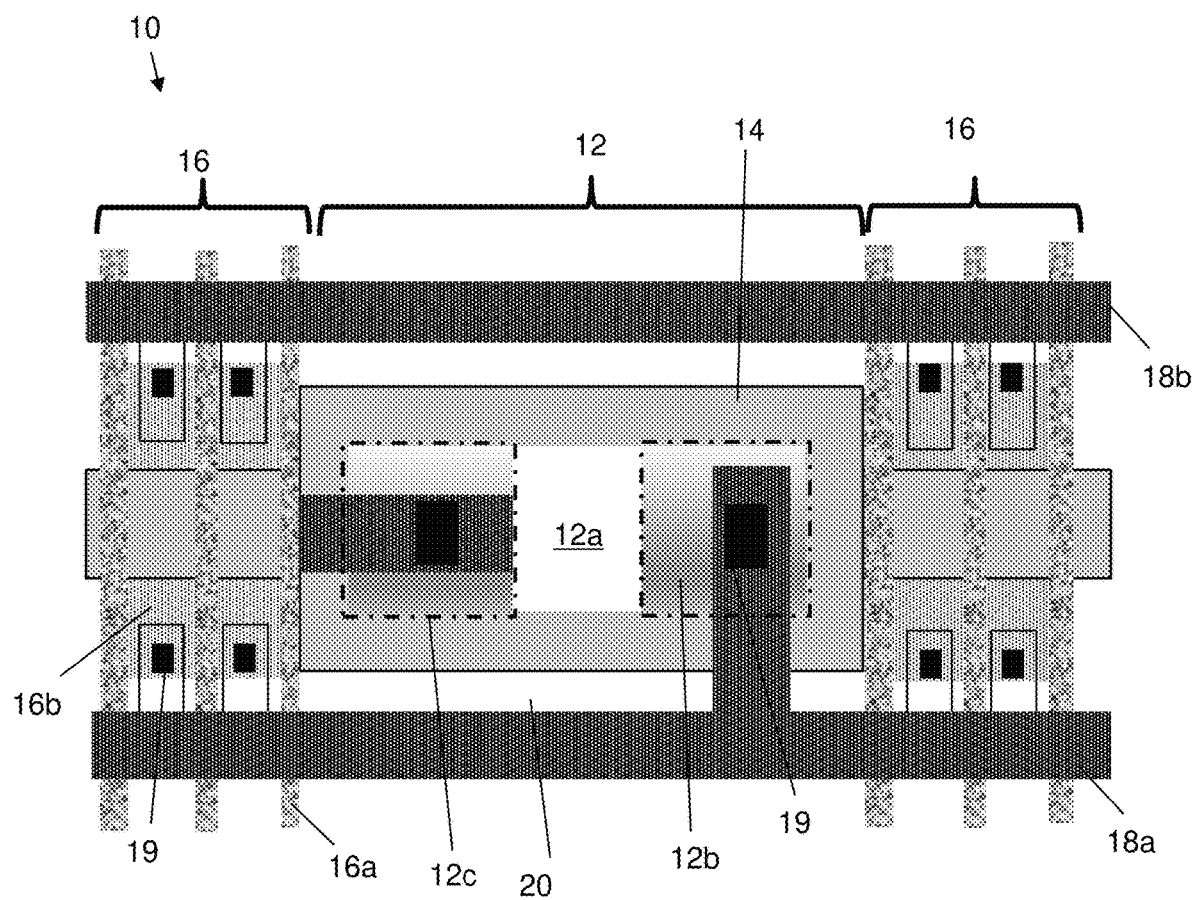
FIG. 1 shows an antenna structure, amongst other features, and respective fabrication processes in accordance with aspects of the present disclosure.

FIG. 1 shows an antenna structure, amongst other features, and respective fabrication processes in accordance with aspects of the present disclosure. The antenna structure 10 of FIG. 1 includes an antenna cell 12 isolated from a P-well bias voltage for an NFET or P-well bias voltage for a PFET by isolation structures 14. In embodiments, the antenna cell 12 includes two islands 12b, 12c within an isolated P-well 12a. The isolated P-well 12a may be surrounded by the isolation structures 14, which also extend into cell regions 16. In embodiments, the isolation structures 14 may be deep trench isolation structures provided in a semiconductor substrate 20 and which extend within the cell regions 16. In embodiments, each cell region 16 has a P-well bias for a PFET and an NFET. For example, an isolated P-well for a PFET can be biased with VPW_P and an isolated p-well for an NFET can be biased with VPW_N. The isolated P-well 12a for the antenna region is not biased with either VPW_P or VPW_N.

Figure 2:
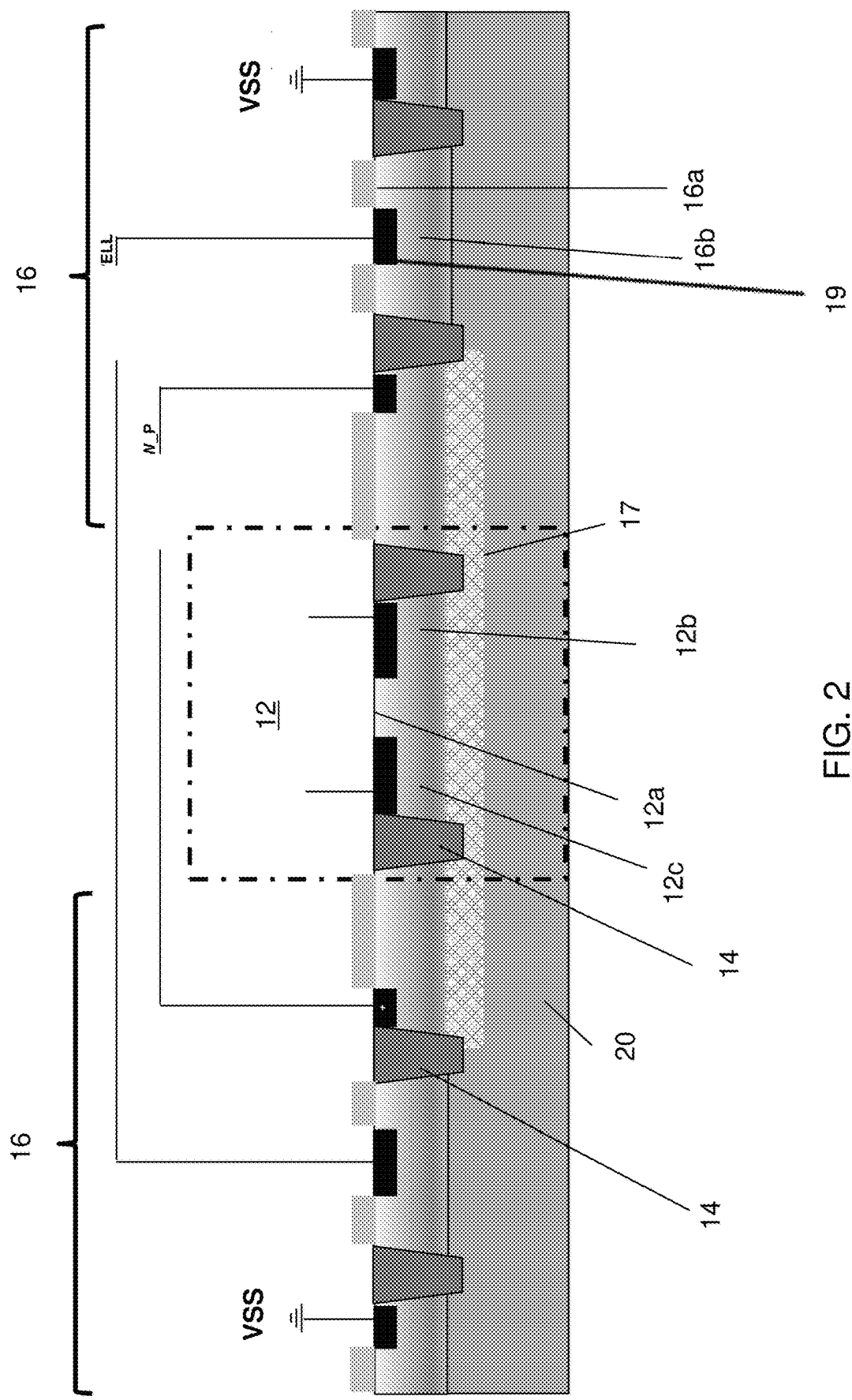
FIG. 2 shows a cross-sectional view of an antenna structure, amongst other features, in accordance with aspects of the present disclosure.

The semiconductor substrate 20 may comprise semiconductor on insulator (SOI) technology. For example, the semiconductor on insulator technology, from bottom to top, includes a handle substrate, a buried insulator layer (i.e., substrate) and a top semiconductor layer. The handle substrate may be a P-substrate. The handle substrate and the top semiconductor layer may include a semiconductor material such as, for example, Si, Ge, SiGe, SiC, SiGeC, a III-V compound semiconductor, II-VI compound semiconductor or any combinations thereof. The buried insulator layer may include a dielectric material such as silicon dioxide, silicon nitride, silicon oxynitride, boron nitride or a combination thereof and, preferably, a buried oxide material (BOX). As shown in FIG. 2, for example, the isolation structures 14 may extend to a deep N-well 17 to isolate the P-well 12a (e.g., P+ diffusion region) of the antenna cell 12.

The isolation structures 14 may be formed by conventional lithography, etching and deposition methods known to those of skill in the art. For example, a resist formed over the semiconductor substrate 20 is exposed to energy (light) and developed utilizing a conventional resist developer to form a pattern (opening). An etching process with a selective chemistry, e.g., reactive ion etching (RIE), will be used to transfer the pattern to the semiconductor substrate 20 to form one or more trenches in the semiconductor substrate 20. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the semiconductor substrate 20 can be removed by conventional chemical mechanical polishing (CMP) processes.

Still referring to FIG. 1, in embodiments, the antenna cell 12 includes island 12b and island 12c. The island 12b comprises a P+ diffusion region within the isolated P-well 12a; whereas the island 12c comprises an N+ diffusion region within the isolated P-well 12a. The P-well 12a is connected to ground (VSS), not a P-well bias voltage for an NFET or P-well bias voltage for a PFET. It should be understood that in smaller technology nodes, a P-well bias voltage for an NFET or P-well bias voltage for a PFET can be either positive or negative such that an antenna diode has a risk to become forward biased. This forward biasing will not occur in the present disclosure as the antenna diode is connected to VSS and is not connected to (e.g., isolated from) the P-well bias voltage for an NFET or P-well bias voltage for a PFET.

More specifically, the P+ diffusion region of the island 12b comprises a contact 19 connected to a wiring structure 18a, e.g., VSS (ground). In contrast, the contact 19 of the N+ diffusion region of island 12c may be a node connected to a metal wiring, for example, to protect the metal wiring from static charge accumulation. In this way, the isolated P-well 12a forms a single antenna diode (e.g., reverse bias diode) connecting to VSS (ground), which cannot be forward biased as it is not connected to (e.g., isolated from) a P-well bias voltage for an NFET or P-well bias voltage for a PFET. It should be understood and recognized by those of skill in the art that as with each of the embodiments, the single diode can represent multiple diodes with each of the diodes connected to VSS (instead of a P-well bias voltage for an NFET or P-well bias voltage for a PFET). As the multiple diodes (e.g., antenna diode(s)) are connected to VSS forward bias risk will be avoided.

A wiring structure 18b may be provided to VDD, which connects to diffusion regions 16b of the additional cells 16. The islands 12b, 12c formed in the isolated P-well 12a are isolated from VDD. The wiring structure 18a may also span the additional cells 16. In embodiments, the additional cells 16 may be representative of filler cells or active cells.

The additional cells 16 may be filler cells including diffusion regions 16b (e.g., source/drain regions) on opposing sides of gate structures 16a. The diffusion regions 16b may be connected to VDD, e.g., wiring structure 18b and VSS, e.g., writing structure 18a. The diffusion regions 16b may be raised diffusion regions formed by an epitaxial growth process with an in-situ doping process. The diffusion regions 16b may also be formed by an ion implantation process.

As shown in FIG. 2, for example, the additional cells, e.g., diffusion regions 16b, may be active cells connected to a P-well bias voltage for an NFET or P-well bias voltage for a PFET. And as shown in FIG. 2, the P-well 12a is completely isolated from the P-well bias voltage for an NFET or P-well bias voltage for a PFET by the isolation structures 14 and deep N-well 17 within the semiconductor substrate 20.

The P-well 12a, N+ diffusion of the island 12c and the P+ diffusion of the island 12b (and other diffusion regions, e.g., deep N-well 17 shown in FIG. 2) may be formed by an ion implantation process. For example, the diffusion regions may be formed by introducing a dopant by, for example, ion implantation in the semiconductor substrate 20 using different masking process which define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 12a and P+ diffusion regions may doped with p-type dopants, e.g., Boron (B). The N+ diffusion region may be doped with n-type dopants, e.g., Arsenic (As), Phosphorus (P) and Sb, among other suitable examples. In embodiments, the diffusion regions 16b may be doped with either n-type or p-type dopants depending on device performance and characteristics, and may include the contacts 19.

The contacts 19 may include a silicide contact to the P+ region of the island 12b and N+ region of the island 12c, in addition to the diffusion regions 16b. As should be understood by those of skill in the art, the silicide process begins with deposition of a thin transition metal layer, e.g., nickel, cobalt or titanium, over fully formed and patterned semiconductor devices (e.g., doped or ion implanted regions). After deposition of the material, the structure is heated allowing the transition metal to react with exposed silicon (or other semiconductor material as described herein) in the active regions of the semiconductor device (e.g. diffusion regions) forming a low-resistance transition metal silicide. Following the reaction, any remaining transition metal is removed by chemical etching, leaving silicide contacts in the active regions of the device.

FIG. 2 shows a cross-sectional view of an antenna structure, amongst other features, in accordance with additional aspects of the present disclosure. As shown in this embodiment, the antenna cell 12 comprises the two islands 12b, 12c which may be isolated from the remaining structures by the isolation structures 14 and the deep N-well 17. In this way, the antenna cell 12 is isolated from a P-well bias voltage for an NFET or P-well bias voltage for a PFET. Also, in this implementation, the additional cells 16 may be active cells comprising gate structures 16a and diffusion regions 16b connected to a P-well bias voltage for an NFET or P-well bias voltage for a PFET.

Figure 3:
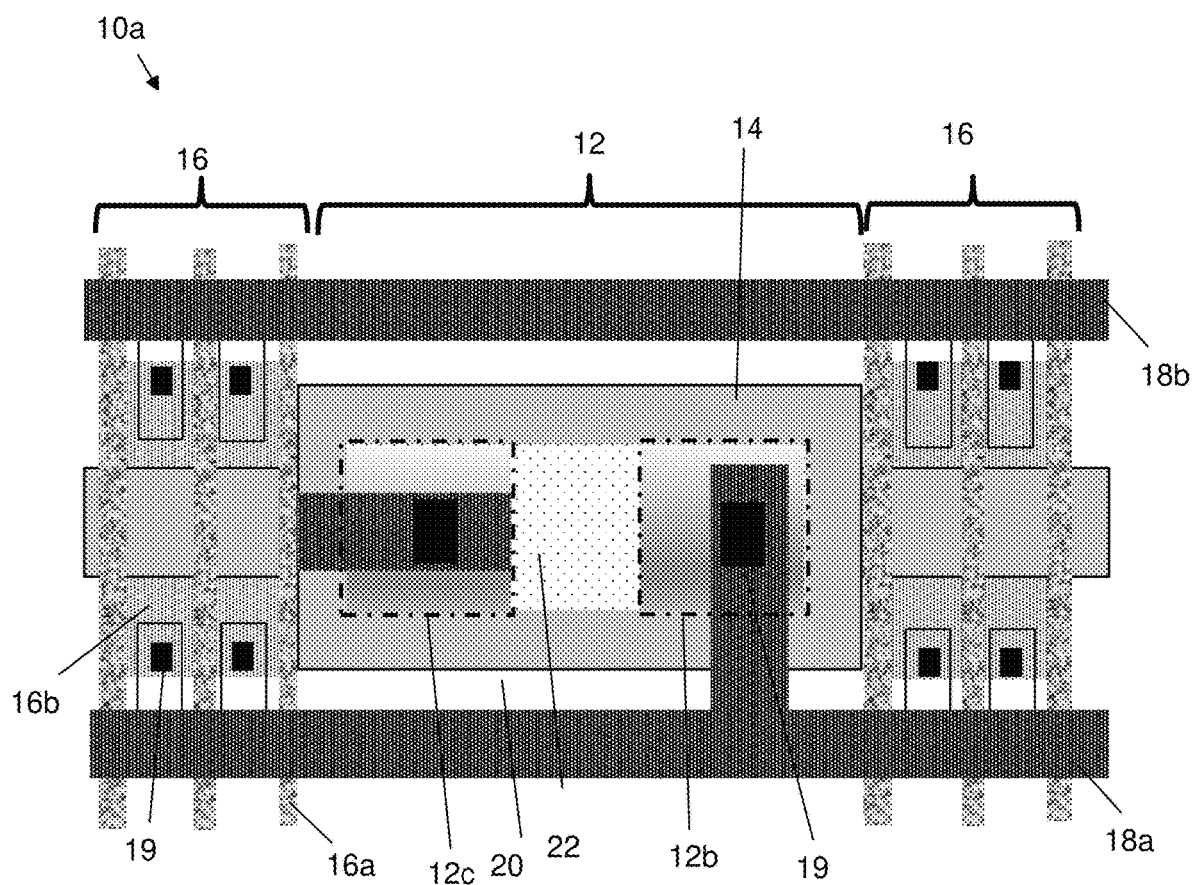
FIG. 3 shows an antenna structure, amongst other features, in accordance with additional aspects of the present disclosure.

FIG. 3 shows an antenna structure, amongst other features, in accordance with additional aspects of the present disclosure. In FIG. 3, the structure 10a includes an antenna cell 12 comprising the two islands 12b, 12c. In this embodiment, though, the two islands 12b, 12c are separated from one another by a shallow trench isolation structure 22. The two islands 12b, 12c and the shallow trench isolation structure 22 may be isolated from other structures, e.g., additional cells, diffusion regions, etc., by the isolation structures 14, e.g., deep trench isolation structures provided in a semiconductor substrate. In the structure 10a of FIG. 3, the island 12b comprises a P+ diffusion region and the island 12c comprises an N+ diffusion region. Similar to the structure 10 in FIG. 1, the isolated P-well 12a is connected to ground (VSS), not a P-well bias voltage for an NFET or P-well bias voltage for a PFET by contact 19 of the P+ diffusion of island 12b connecting to wiring structure 18a, e.g., VSS (ground). In this way, the isolated P-well 12a forms a single antenna diode (e.g., reverse bias diode) connecting to VSS. The remaining features of the structure 10a are similar to the structure 10 of FIG. 1.

Figure 4:
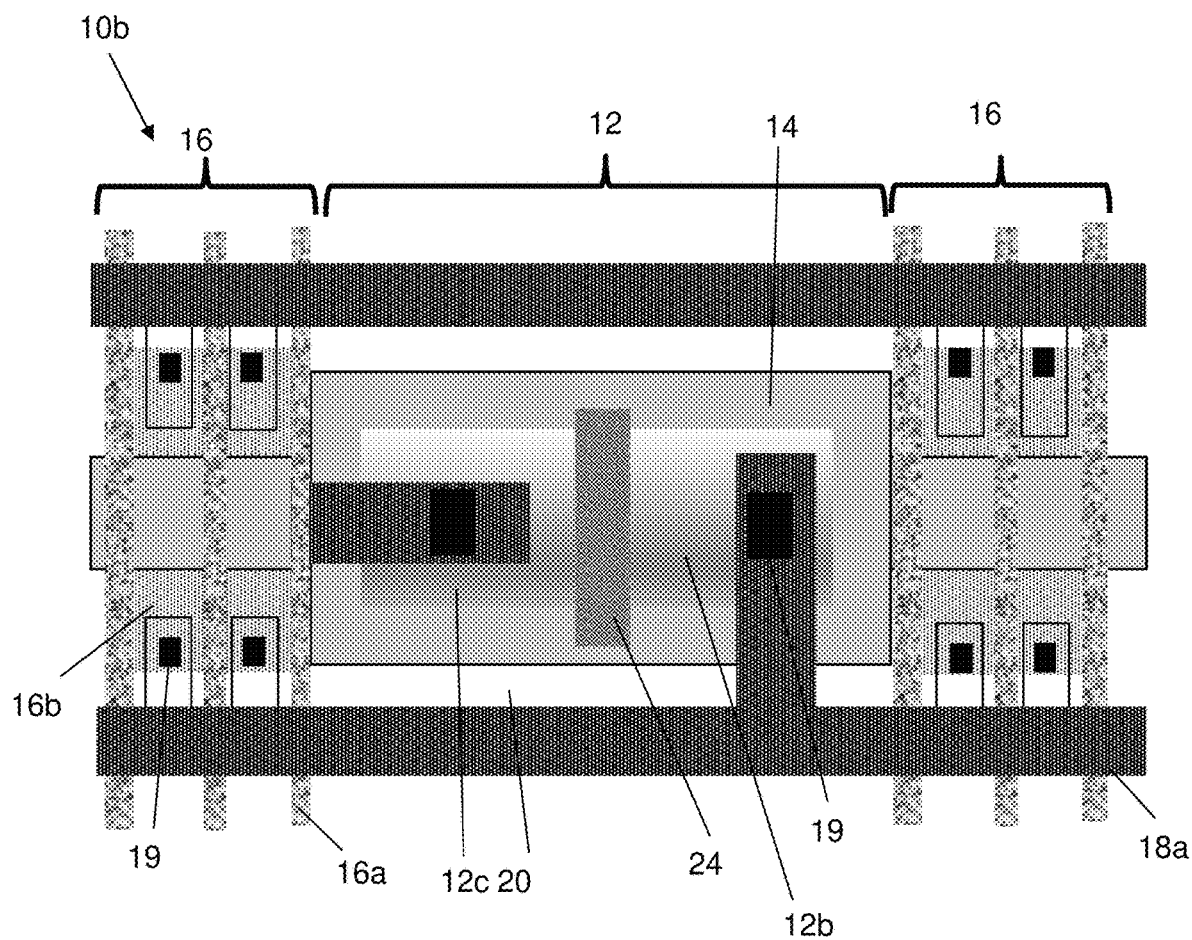
FIG. 4 shows an antenna structure, amongst other features, in accordance with additional aspects of the present disclosure.

FIG. 4 shows an antenna structure, amongst other features, in accordance with additional aspects of the present disclosure. In FIG. 4, the structure 10b includes an antenna cell 12 comprising a P+ diffusion region 12b and an N+ diffusion 12c, separated or isolated from one another by a floating gate structure 24 (or a gate connected to another node). In this embodiment, two contacts 19 are formed to the respective P+ diffusion region 12b and N+ diffusion 12c, with a contact 19 of the P+ diffusion region 12b connected to ground (VSS), not a P-well bias voltage for an NFET or P-well bias voltage for a PFET. In this way, the P+ diffusion region 12d forms a single antenna diode (e.g., reverse bias diode) connecting to VSS. The P+ diffusion region 12b and the N+ diffusion 12c are also isolated from other structures, e.g., additional cells, diffusion regions, etc., by the isolation structures 14, e.g., deep trench isolation structures. The remaining features of the structure 10b are similar to the structure 10 of FIG. 1.

Although not critical to the understanding of the present disclosure, the floating gate structure 24 (and other gate structures) may be fabricated using conventional CMOS processes. For example, in the standard CMOS processing, a gate dielectric and polysilicon are formed, e.g., deposited, onto the substrate material, followed a patterning process. An insulator material such as nitride or oxide can be deposited on the patterned materials, followed by an anisotropic etching process to form sidewalls.

The antenna structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an antenna cell comprising a single P-well isolated by a deep trench isolation structure and comprising at least one diffusion region,
the structure further comprising a deep N-well in a semiconductor substrate which, with the deep trench isolation structure, isolates the antenna cell, wherein the deep trench isolation structure extends into the deep N-well.

2. The structure of claim 1, wherein the at least one diffusion region is connected to ground.

3. The structure of claim 1, wherein the at least one diffusion region comprises a P+ island within the single P-well, and which connects the antenna cell to ground.

4. The structure of claim 1, wherein the at least one diffusion region of the antenna cell further comprises a P+ diffusion region and an N+ diffusion region within the single P-well.

5. The structure of claim 4, wherein the N+ diffusion region comprises a node connected to a metal wiring to protect the metal wiring from static charge accumulation.

6. The structure of claim 1, wherein the single P-well comprises a reverse bias diode connected to ground and not a P-well bias voltage for an NFET or P-well bias voltage for a PFET.

7. The structure of claim 1, wherein the antenna cell comprising multiple diodes connected to ground and not to a P-well bias voltage for an NFET or P-well bias voltage for a PFET.

8. A structure comprising an antenna cell comprising a single P-well isolated by a deep trench isolation structure and comprising at least one diffusion region, wherein the single P-well includes two islands of different diffusions separated by a shallow trench isolation structure, wherein a first of the two islands comprises the diffusion region connected to ground and a second of the two islands is connected to a metal wiring to protect the metal wiring from static charge accumulation.

9. A structure comprising an antenna cell comprising a single P-well isolated by a deep trench isolation structure and comprising at least one diffusion region, wherein the single P-well includes two islands of different diffusions separated by a gate structure, wherein a first of the two islands comprises the diffusion region connected to ground and a second of the two islands is connected to a metal wiring to protect the metal wiring from static charge accumulation.

10. A structure comprising:
an antenna cell comprising a first diffusion region of a first dopant type isolated from a second diffusion region of a second dopant type, both of the first diffusion region and the second diffusion region being in a well of the first dopant type;
a contact to ground and the antenna cell; and an isolation structure isolating the antenna cell from other structures on a chip, wherein the first diffusion region, the second diffusion region and the well comprise a single reverse diode connected only to ground.

11. The structure of claim 10, wherein the isolation structure comprises a deep trench isolation structure.

12. The structure of claim 11, wherein the isolation structure further comprises a deep N-well in a semiconductor substrate.

13. The structure of claim 12, wherein the antenna cell is isolated from a P-well bias voltage for an NFET or P-well bias voltage for a PFET.

14. The structure of claim 10, wherein the first dopant type is a p-type dopant.

15. The structure of claim 10, wherein the first diffusion region is isolated from the second diffusion region by a shallow trench isolation region.

16. The structure of claim 10, wherein the first diffusion region is isolated from the second diffusion region by a gate structure.

17. A method comprising forming an antenna cell comprising a single P-well isolated by a deep trench isolation structure and comprising at least one diffusion region,
wherein forming the antenna cell further comprising forming a deep N-well in a semiconductor substrate which, with the deep trench isolation structure, isolates the antenna cell, and wherein the deep trench isolation structure extends into the deep N-well.

* * * * *